United States Patent
Saito et al.

(10) Patent No.: US 7,170,339 B2
(45) Date of Patent: Jan. 30, 2007

(54) DIGITAL AMPLIFIER

(75) Inventors: Hiroshi Saito, Saitama (JP); Hiroyasu Nakano, Saitama (JP)

(73) Assignee: Sony Corporation, Tokyo (JP)

( * ) Notice: Subject to any disclaimer, the term of this patent is extended or adjusted under 35 U.S.C. 154(b) by 76 days.

(21) Appl. No.: 10/944,585

(22) Filed: Sep. 17, 2004

(65) Prior Publication Data

US 2005/0062527 A1    Mar. 24, 2005

(30) Foreign Application Priority Data

Sep. 19, 2003    (JP)    ............................ P2003-327741

(51) Int. Cl.
*H03F 3/38*    (2006.01)
(52) U.S. Cl. ..................... 330/10; 330/207 A; 330/297
(58) Field of Classification Search .................. 330/10, 330/207 A, 251, 297
See application file for complete search history.

(56) References Cited

U.S. PATENT DOCUMENTS

| | | | |
|---|---|---|---|
| 4,992,749 A | 2/1991 | Tokumo et al. ................ 330/10 |
| 5,767,740 A * | 6/1998 | Fogg ............................ 330/10 |
| 5,898,340 A * | 4/1999 | Chatterjee et al. ........... 330/251 |
| 6,388,514 B1 | 5/2002 | King et al. .................... 330/10 |
| 6,925,115 B1 * | 8/2005 | Andersen et al. .............. 330/10 |

FOREIGN PATENT DOCUMENTS

| | | |
|---|---|---|
| JP | 2001-202696 A | 7/2001 |
| WO | WO 00 72627 | 11/2000 |
| WO | WO 03 055059 | 7/2003 |
| WO | WO 2004 015855 | 2/2004 |

* cited by examiner

*Primary Examiner*—Khanh Van Nguyen
(74) *Attorney, Agent, or Firm*—Finnegan, Henderson, Farabow, Garrett & Dunner, L.L.P.

(57) ABSTRACT

To provide a digital amplifier advantageously performing volume adjustment over a wide range. A first and second field effect transistors include N-channel type field effect transistors. The first field effect transistor has the drain connected to the operation voltage Vreg, the source connected to the drain of the second field effect transistor and the gate to which the first input signal is applied from the first level shifter for on/off operation. The second field effect transistor has the source connected to the ground potential as the reference voltage and the gate to which the second input signal is applied from the second level shifter for on/off operation.

5 Claims, 8 Drawing Sheets

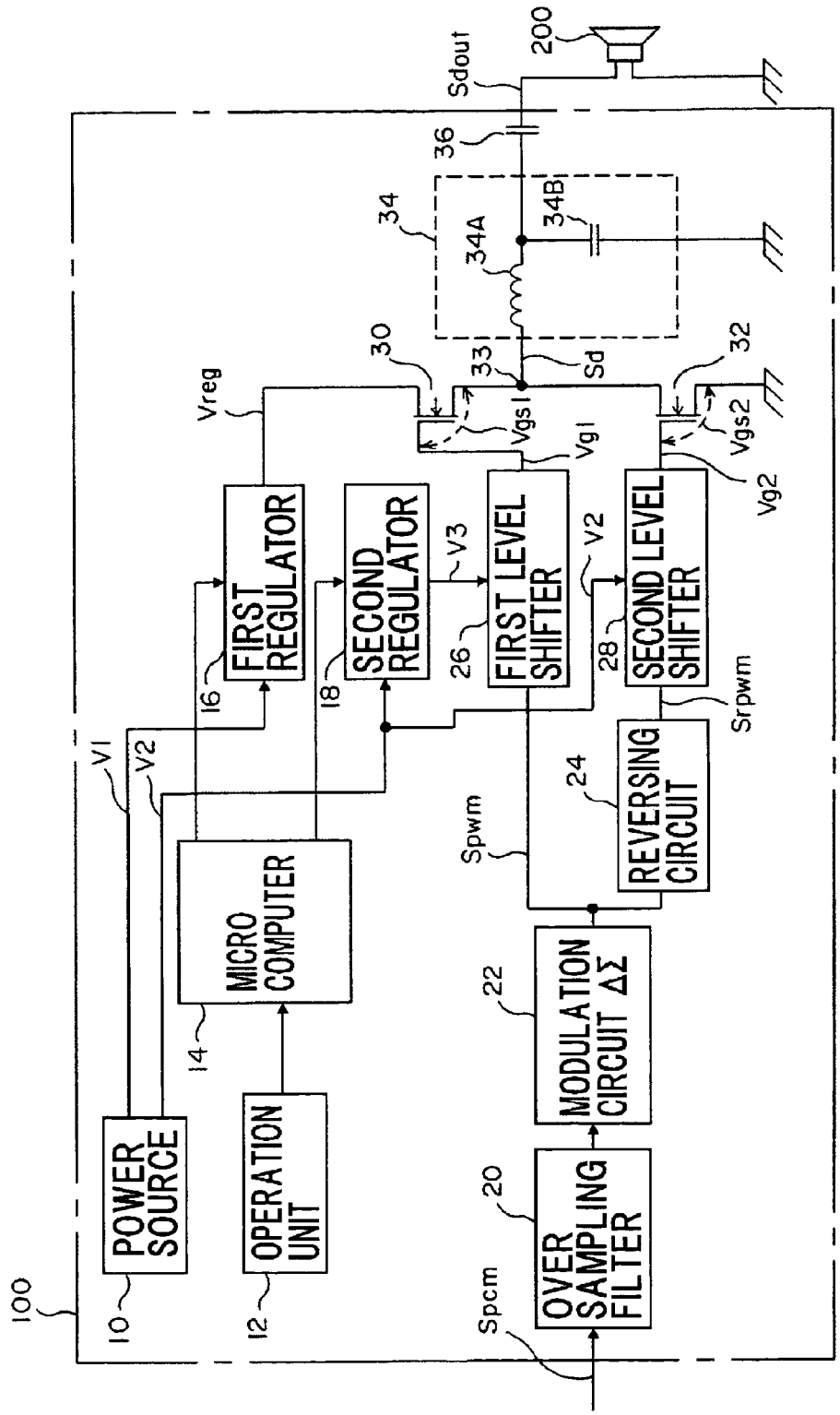

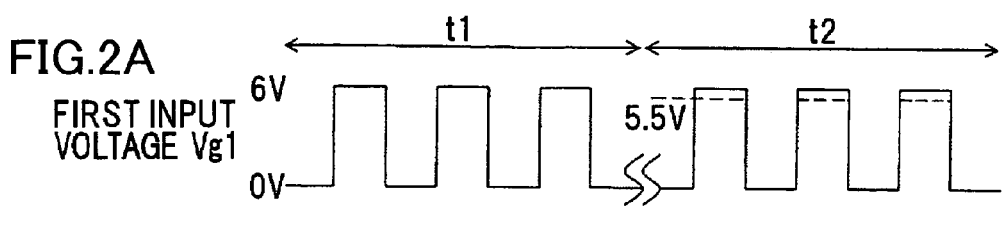
FIG.2A FIRST INPUT VOLTAGE Vg1
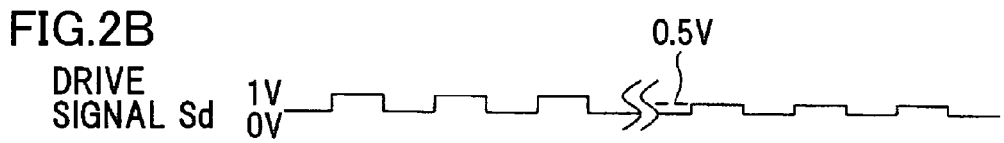
FIG.2B DRIVE SIGNAL Sd
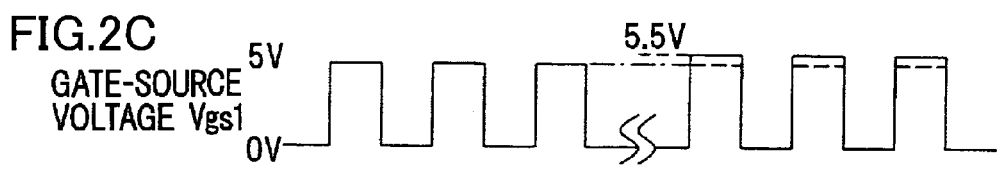
FIG.2C GATE-SOURCE VOLTAGE Vgs1
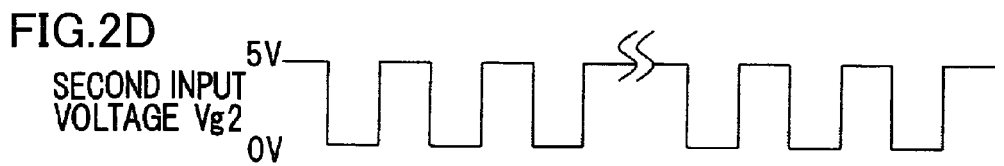
FIG.2D SECOND INPUT VOLTAGE Vg2
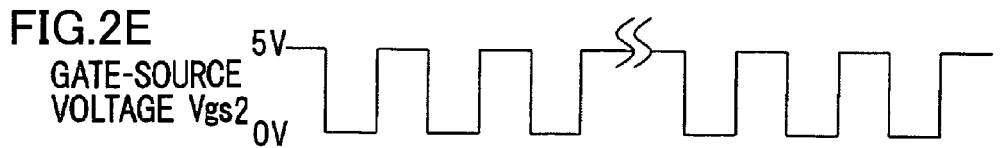
FIG.2E GATE-SOURCE VOLTAGE Vgs2

FIRST INPUT
SIGNAL Spwm

SECOND INPUT
SIGNAL Srpwn

GATE VOLTAGE
Vg1

GATE VOLTAGE
Vg2

DRIVE SIGNAL
Sd

DRIVE SIGNAL
Sd1

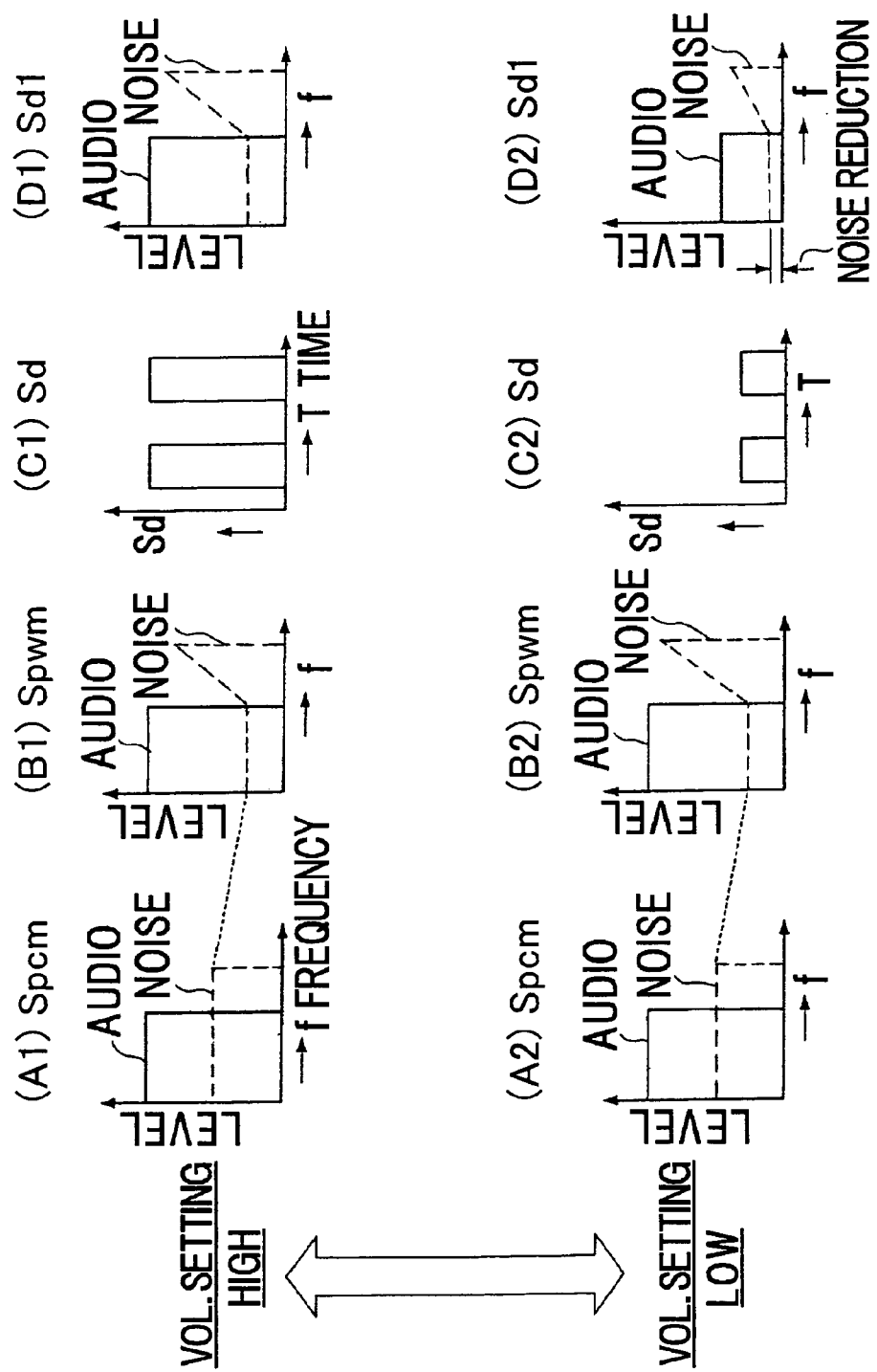

DIGITAL AMPLIFIER

CROSS REFERENCE TO RELATED APPLICATIONS

The present document is based on Japanese Priority Document JP2003-327741, filed in the Japanese Patent Office on Sep. 19, 2003, the contents of which being incorporated herein by reference to the extent permitted by law.

BACKGROUND OF THE INVENTION

1. Field of the Invention

The present invention relates to a digital amplifier.

2. Related Art

A digital amplifier is constructed to convert a pulse coded modulation-type (referred to as PCM below) input signal which is obtained by playing a CD or MD into a pulse width modulation-type (referred to as PWM below) input signal, to generate a driving signal by switching an operation voltage by switching means based on such PWM type input signal and to supply an audio signal converted by passing through a low pass filter to audio output means such as a speaker or the like.

Conventionally, a volume adjustment of a digital amplifier is carried out by using a digital attenuator (a digital volume). In other words, before converting the PCM type signal into the PWM type signal, a designated processing (for example, bit shift from the upper digit to the lower digit) is carried out on the PCM type signal (digital data) by the digital attenuator. By carrying out the designated processing on the PCM type signal, if the volume is turned down, more digital data will lack and thus degradation of the output audio quality is unavoidable.

In order to avoid such inconvenience, proposed is a digital amplifier to carry out volume adjustment by controlling the above mentioned operation voltage to be supplied to the above mentioned digital switching means. For example, see Japanese patent application publication JP-A-2001-202696.

As shown in FIG. 8, such digital amplifier includes switching means 300 including a P-channel field effect transistor 302 and an N-channel field effect transistor 304.

Also, the source terminal of the P-channel field effect transistor 302 is connected to a first operation voltage +V, while the source terminal of the n-channel field effect transistor 304 is connected to a second operation voltage −V. The drain terminals of the P-channel field effect transistor 302 and the N-channel field effect transistor 304 are commonly connected to an output terminal. The gate terminals of the P-channel field effect transistor 302 and the N-channel field effect transistor 304 are commonly connected to an input terminal to which the above mentioned PMW type input signal Spwm is inputted.

Then, by turning on and off the field effect transistors 302, 304 in response to the input signal Spmw, the operation voltages +V and −V are switched, thereby outputting a driving signal Sd from the output terminal.

However, in the above mentioned conventional digital amplifier, switching operation is interrupted if the first operation voltage +V is below the minimum gate-source voltage Vgs which is required for switching the P-channel field effect transistor 302.

Therefore, it is possible to normally carry out volume adjustment in the range when the operation voltage exceeds the above mentioned minimum value but volume adjustment is impossible in the range when the operation voltage is below the above mentioned minimum voltage, thereby restricting the range of volume adjustment.

In consideration of the above circumstances, the present invention has been conceived in order to provide an advantageous digital amplifier which is capable of performing volume adjustment over a relatively wide range.

SUMMARY OF THE INVENTION

In order to achieve the above object, the digital amplifier according to a preferred embodiment of the present invention includes a switching means for outputting a driving signal by switching a DC voltage as the operation voltage in response to a pulse width modulation input signal and operation voltage control means for controlling the value of the operation voltage, wherein the switching means has input signal conversion means as well as first and second field effect transistors of mutually identical polarity, the drain of the first field effect transistor being connected to the operation voltage, the source of the first field effect transistor and the drain of the second field effect transistor being connected in common to the output terminal of the switching means, and the source of the second field effect transistor being connected to a designated reference voltage; and the input signal conversion means generates a first input signal in phase with the input signal and a second input signal of inverted phase with respect to the input signal with the first input signal being applied to the gate of the first field effect transistor and the second input signal being applied to the gate of the second field effect transistor.

Also, the digital amplifier according to another preferred embodiment of the present invention includes a switching means for outputting a driving signal by switching a DC voltage as the operation voltage in response to a pulse width modulation type input signal, and operation voltage controlling means for controlling the operation voltage, wherein the switching means has first and second input signal conversion means and first, second, third and fourth field effect transistors of identical polarity one another, the drains of the first and the third field effect transistors being connected to the operation voltage, the source of the first field effect transistor and the drain of the second field effect transistor being connected in common to a first output terminal of the switching means for outputting the driving signal, the source of the third field effect transistor and the drain of the fourth field effect transistor being connected in common to a second output terminal for outputting the driving signal, the sources of the second and fourth field effect transistors being connected to a designated reference voltage; the first input conversion means generates a first input signal in phase with the input signal and a second input signal of inverted phase with respect to the input signal, the first input signal being applied to the gate of the first field effect transistor, while the second input signal being applied to the gate of the second field effect transistor; and the second input conversion means generates a third input signal of the inverted phase with respect to the input signal and a fourth input signal in phase with the input signal, the third input signal being applied to the gate of the third field effect transistor, while the fourth input signal being applied to the gate of the fourth field effect transistor.

As a result, according to a preferred embodiment of the present invention, the operation voltage is switched by the first and second field effect transistors of identical polarity with the drain of the first field effect transistor being connected to the operation voltage, the source of the first field effect transistor and the drain of the second field effect transistor being connected in common to the output terminal of the switching means for outputting the driving signal, the source of the second field effect transistor being supplied to the designated reference voltage, thereby enabling to set the gate-source voltages of the first and second field effect transistors regardless of the operation voltage and thus performing volume adjustment over a wide range without any restriction on the switching operation of the first and second field effect transistors by the operation voltage.

Also, according to a preferred embodiment of the present invention, the operation voltage is switched by the first, second, third and fourth field effect transistors of identical polarity. The drain of the first and third field effect transistors are connected to the operation voltage, the source of the first field effect transistor and the drain of the second field effect transistor are connected in common to a first output terminal of the switching means for outputting the driving signal, the source of the third field effect transistor and the drain of the fourth field effect transistor are connected in common to a second output terminal of the switching means for outputting the driving signal, and the sources of the second and fourth field effect transistors are connected to the reference potential, thereby enabling to set the gate-source voltages of the first, second, third and fourth field effect transistors without any restriction by the operation voltage. As a result, the switching operations of the first, second, third and fourth transistors are unaffected by the operation voltage and thus advantageously performing volume adjustment over a wide range.

BRIEF DESCRIPTION OF THE DRAWINGS

The above and other objects and features of the preferred embodiments of the present invention will become more apparent to those of ordinary skill in the art from the following detailed description taken in conjunction with the accompanying drawings in which:

[FIG. 1]: is a block diagram to show a simplified construction of the digital amplifier according to the embodiment 1;

[FIGS. 2A to 2E]: are waveforms on various parts of first and second field effect transistors 30, 32;

[FIGS. 4A1 to D2] are noise spectrum and waveforms in the digital amplifier 100;

DETAILED DESCRIPTION OF THE PREFERRED EMBODIMENTS OF THE INVENTION

Figure 3A:
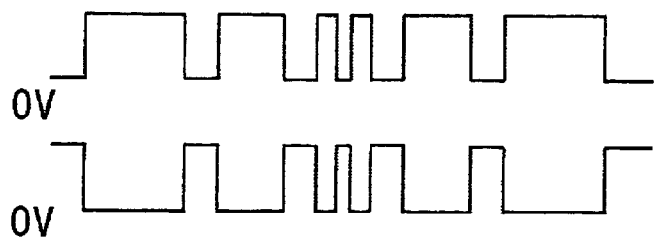
[FIGS. 3A to 3F]: are waveforms on various parts in the digital amplifier.
Figure 3B:
Figure 3C:
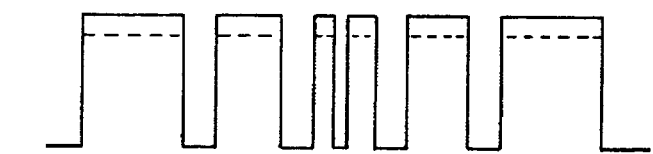
Figure 3D:
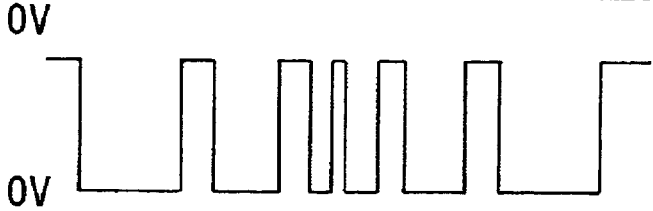

In order to perform such volume adjustment over a wide range, the operation voltage is switched by using a first and a second field effect transistors of identical polarity with each other.

Alternatively, it is achieved by switching the operation voltage by using a first, second, third and fourth field effect transistors of identical polarity with one another.

[Embodiment 1]

Now, an embodiment 1 according to a preferred embodiment of the present invention will be described by reference to the drawings.

FIG. 1 is a block diagram to show a simplified construction of an embodiment 1 of a digital amplifier according to a preferred embodiment of the present invention.

As shown in FIG. 1, a digital amplifier 100 is connected to an audio source such as, for example, a CD player, a DVD player or the like (not shown) for receiving a PCM type input signal Spcm from such audio source and supplies a driving signal Sdout to audio output means 200 such as a speaker or the like connected to the digital amplifier 100.

The digital amplifier 100 includes a power supply unit 10, an operation unit 12, a micro computer 14, first and second regulators 16, 18, an over-sampling filter 20, a ΔΣ modulation circuit 22, an inverter circuit 24, first and second level shifters 26, 28, first and second field effect transistors 30, 32, a low pass filter 34, a coupling capacitor 36 and the like. It is constructed so that the power supply unit 10 generates first and second voltages V1 and V2 which are constant DC voltages, wherein the first voltage V1 is supplied to the first regulator 16, while the second voltage V2 is supplied to the second regulator 18 and the second level shifter 28. The operation unit 12 includes an operation switch or an operation knob for volume adjustment under control by the user. By controlling such operation switch or operation knob, volume setting data indicating the setting of the volume is inputted to the micro computer 14. The first regulator 16 generates the operation voltage Vreg which is a positive DC voltage to be supplied to the drain of the first field effect transistor 30 based on the first voltage V1 and the microcomputer 14 is constructed to control the operation voltage Vreg.

The control of the operation voltage Vreg by the micro computer 14 is made in response to the above mentioned volume setting data which is generated by the operation of the operation unit 12. The second regulator 18 generates a third voltage V3 based on the second voltage V2 and the third voltage V3 is a DC voltage to be supplied to the first level shifter 26 based on the second voltage V2 under control of the micro computer 14. The control of the third voltage V3 by the micro computer will be described hereinafter.

The over-sampling filter 20 receives the PCM type input signal Spcm and the ΔΣ modulation circuit 22 receives the output signal from the over-sampling filter 20 to generate the PWM type input signal Spwm. In this example of preferred embodiment of the present invention, the over-sampling filter 20 and the ΔΣ modulation circuit 22 constitute pulse width modulation conversion means as recited in the claim. As shown in FIG. 2(A), the input signal Spwm has a constant crest value with respect to the reference voltage (the ground potential in this example of preferred embodiment of the present invention) and the duty factor of the input signal Spwm is proportional to the amplitude of the driving signal Sd, i.e., volume.

The inverter circuit 24 generates an input signal Srpwm which inverted the phase of the PWM type input signal Spwm outputted from the ΔΣ modulation circuit 22. For convenience in the following description, the input signal which is applied to the first level shifter 26 from the ΔΣ modulation circuit 22 is referred to as a first input signal Spwm, while the input signal which is applied to the second level shifter 28 from the inverter circuit 24 is referred to as a second input signal Srpwm. The first level shifter 26 and the second level shifter 28 convert the amplitude (crest value) of the first and second input signal Spwm and Srpwm before being applied to the gates of the first and second field effect transistors 30 and 32, respectively.

Describing more in detail, since the first and second input signals Spwm and Srpwm outputted from the ΔΣ modulation circuit 22 and the inverter circuit 24 have about 2V amplitude and are less than the minimum value of the gate-source voltage Vgs which is required for driving the first and second field effect transistors 30, 32, the first and second level shifters 26, 28 convert the amplitudes to about 6V. It is to be noted that the minimum value of the gate-source voltage Vgs differs depending on types and characteristics of such field effect transistor. Since the first level shifter 26 converts the amplitude of the first input signal Spwm based on the third voltage V3 which is supplied from the second regulator 18, the third voltage V3 increases or decreases under control of the micro computer 14, thereby increasing or decreasing the first input signal Spwm outputted from the first level shifter 26.

Since the second level shifter 28 converts the amplitude of the second input signal Srpwm based on the constant second voltage V2 which is supplied from the power supply unit 10, the amplitude of the second input signal Srpwm outputted from the second level shifter 28 is constant.

The first and second field effect transistors 30, 32 are the identical polarity with each other, i.e., the first and the second field effect transistors 30, 32 are N-channel field effect transistors in this example of preferred embodiment of the present invention.

The first field effect transistor 30 has the drain connected to the operation voltage Vreg and the source connected to the drain of the second field effect transistor 32 and the gate for receiving the first input signal Spwm which is applied from the first level shifter 26, thereby performing on/off operation in response to the first input signal Spwm.

The second field effect transistor 32 has the source connected to the ground potential as the reference voltage and the gate for receiving the second input signal Srpwm from the second level shifter 28 for performing on/off operation.

The junction point of the source of the first field effect transistor 30 and the drain of the second field effect transistor 32 constitutes an output terminal 33 from which the PWM type driving signal Sd is outputted.

Accordingly, since the first input signal Spwm inputted to the gate of the first field effect transistor 30 and the second input signal Srpwm inputted to the gate of the second field effect transistor 32 are inverted in phase with each other, the first field effect transistor 30 and the second field effect transistor 32 are driven in such a manner that one of them is in the on state while the other is in the off state.

Therefore, in the condition when the first field effect transistor 30 is on and the second field effect transistor 32 is off, the operation voltage Vreg is outputted on the output point 33. On the other hand, in the condition when the first transistor 30 is off and the second field effect transistor 32 is on, the ground potential appears on the output point 33.

In other words, the driving signal Sd is a PWM type signal having the same amplitude (crest value) as the operation voltage Vreg.

The low pass filter 34 passes only signal components of the audio frequency bandwidth in the driving signal Sd which is applied from the output terminal 33, i.e., is constructed to convert the driving signal Sd into an audio signal of the audio bandwidth.

In this example of preferred embodiment of the present invention, the low pass filter 34 is an LC filter comprising an inductance 34A and a capacitor 34B.

The coupling capacitor 36 eliminates DC component from the driving signal Sd which is applied from the low pass filter 34 and applies only AC components to the audio output means 200 as the driving signal Sdout.

The control of the third voltage V3 by the micro computer 14 will now be described below.

FIG. 2 shows waveforms on various parts of the first and second field effect transistors 30, 32.

FIG. 2(A) is the gate voltage Vg1 of the first field effect transistor 30 (the first input signal Spwm applied from the first level shifter 26), FIG. 2(B) is the driving signal Sd on the output terminal 33 (the source voltage of the first field effect transistor 30), FIG. 2(C) is the gate-source voltage Vgs1 of the first field effect transistor 30, FIG. 2(D) is the gate voltage Vg2 of the second field effect transistor 32 (the second input signal Srpwm applied from the second level shifter 28), and FIG. 2(E) is the gate-source voltage Vgs2 of the second field effect transistor 32.

In this example of preferred embodiment of the present invention, it is assumed that the minimum gate-source voltages Vgs1 and Vgs2 required for operating the first and second field effect transistors 30, 32 are 5V.

Firstly, it is assumed that the operation voltage Vreg is 1V for a certain time interval t1.

At this time, in order to make the gate-source voltage Vgs1 of the first field effect transistor 30 equal to 5V, the gate-source voltage Vg1 is Vgs1+Vreg=5V+1V=6V as shown in FIGS. 2(A)-(C). This is because the source voltage (the driving signal Sd) is 1V when the first field effect transistor 30 is on.

On the other hand, it is assumed that the operation voltage Vreg is 0.5V for a time interval t2. At this time, in the first field effect transistor 30, if the gate voltage Vg1 is continued to remain as 6V as shown in the solid line (A), the gate-source voltage Vgs1 changes to Vgs1=Vg1−Vreg=6V−0.5V=5.5V as shown by the solid line (C).

As described hereinabove, if there is any change in the gate-source voltage Vgs1 under the condition when the first field effect transistor 30 is on, the on resistance between the drain and the source fluctuates, thereby resulting in degrading the distortion factor of the audio which is outputted from the audio output means 200.

Accordingly, in order to overcome such adverse effect, the present invention is constructed in such a manner that the micro computer 14 controls the amplitude of the gate voltage (first input signal) Vg1 in response to the change in the operation voltage Vreg to make the gate-source voltage Vgs1 of the first field effect transistor 30 substantially constant.

Specifically, the micro computer 14 controls the first level shifter 26 by way of the second regulator 18 and changes the amplitude of the gate voltage Vg1 from 6V (solid line) to 5.5V (dotted line) in response to the change of the operation voltage from 1V to 0.5V as shown in FIG. 2 (A) in the time interval t2, thereby maintaining the amplitude of the gate-source voltage Vgs1 at 5V (dotted line).

It is to be noted that, since the source of the second field effect transistor 32 is connected to the reference voltage (the ground potential), the amplitude of the gate-source voltage Vgs2 of the second field effect transistor 32 remains the same amplitude as the gate voltage (the second input signal) Vg2 even if the operation voltage Vreg may change as shown in FIGS. 2(D) and (E), thereby not exhibiting the phenomenon to change the on resistance between the drain-source of the second field effect transistor 32.

Accordingly, unlike the case of the first field effect transistor 30, the second field effect transistor 32 has no need to control the amplitude of the gate voltage Vg2 in response to the operation voltage Vreg. This is the reason why the second voltage V2 which is supplied to the second level shifter 28 from the power supply 10 is fixed.

In addition, in this example of preferred embodiment of the present invention, the micro computer 14 and the first regulator 16 constitute the operation voltage control means as recited in the claim.

The second regulator 18, the inverter circuit 24, the first level shifter 26 and second level shifter 28 constitute the input signal conversion means as recited in the claim.

The micro computer 14, the second regulator 18 and the first level shifter 26 constitute the input signal control means as recited in the claim.

The input signal conversion means and the first and second field effect transistors 30, 32 constitute the switching means as recited in the claim. However, it is to be noted the operation voltage control means, the input signal conversion means and the input signal control means are not restricted to the particular constructions in this example of preferred embodiment of the present invention. It is needless to say that they can be realized in various known circuit configurations.

Now, the operation of the digital amplifier 100 having the above construction will be described as follows.

Shown in FIG. 3 are waveforms on various parts of the digital amplifier. Assuming that the user operates the operation portion 12 to set the volume to, for example, a first value, the first regulator 16 is controlled by the micro computer 14 to set the operation voltage Vref to a value corresponding to the first value.

As a result, the PCM type input signal Spcm is converted into the input signal Spwm by the over-sampling filter 20 and the ΔΣ modulation circuit 22.

Then, the first input signal Spwm in phase with the input signal Spwm is applied to the first level shifter 26, while the second input signal Srpwm which is in a reverse phase relationship with the first input signal Spwm is applied to the second level shifter 28 (FIGS. 3(A) and (B). In this way, the gate voltage Vg1 is applied to the gate of the first field effect transistor 30 from the first level shifter 26, while the gate voltage Vg2 is applied to the gate of the second field effect transistor 32 from the second level shifter 28 (FIGS. 3(C) and (D)), thereby forcing the first and second field effect transistors 30, 32 to perform switching operation.

Figure 3E:
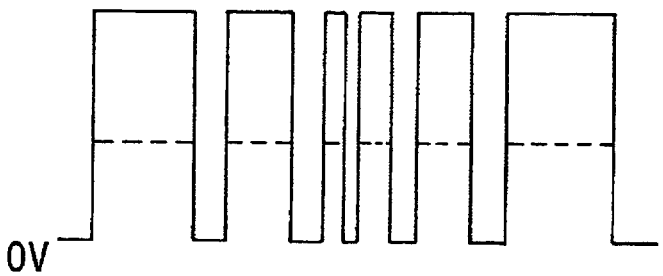

As a result, the driving voltage Vreg is switched and the driving signal Sd is outputted from the output terminal 33 (FIG. 3(E)).

Figure 3F:
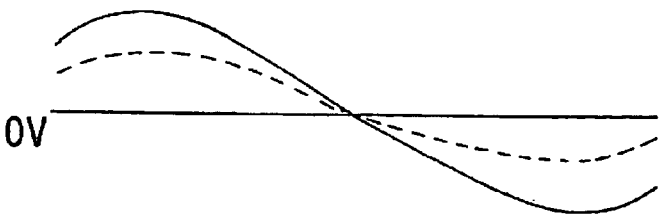

The driving signal Sd is converted into the audio signal of the audio bandwidth by the low pass filter 34 and applied to audio output menas 200 as the driving signal Sdout after eliminating the DC component by the coupling capacitor 36, thereby outputting the audio (sound) signal from the audio output means 200 (FIG. 3(F), solid line).

If the user controls the operation unit 12 to set the volume to, for example, a second value which is lower than the first value, the first regulator 16 is controlled by the micro computer 14 so that the operation voltage Vreg is set to a value corresponding to the second value.

Subsequently, the amplitude of the gate voltage Vg1 is controlled by the micro computer 14 in response to the change in the operation voltage Vreg so that the gate-source voltage Vgs1 of the first field effect transistor 30 remains substantially constant. The amplitude of the first input signal Vg1 is controlled to the value a shown by the solid line in FIG. 3(C) in response to the change in the operation voltage Vreg, thereby maintaining the amplitude of the gate-source voltage Vgs1 substantially constant.

In a similar way to the case as described hereinabove, by forcing the first and second field effect transistors 30, 32 to perform switching operation, the operation voltage Vreg as decreased in response to the second value is switched and the driving signal Sd of the reduced amplitude is outputted from the output terminal 33 as shown by the dotted line in FIG. 3(E).

Accordingly, the amplitude of the driving signal Sd applied from the audio output means 200 is reduced as shown by the dotted line in FIG. 3(F), thereby reducing the volume of the audio (sound) signal outputted from the audio output means 200.

As described hereinabove, the digital amplifier 100 according to this example of preferred embodiment of the present invention exhibits the following advantages:

1) Because of the construction to switch the operation voltage Vreg by the first and second field effect transistors 30, 32 of identical polarity, connect the drain of the first field effect transistor 30 to the operation voltage Vreg, commonly connect the source of the first field effect transistor 30 and the drain of the second field effect transistor 32 to the output terminal 33 of the switching means for outputting the driving signal Sd and connect the source of the second field effect transistor 32 to the designated reference voltage, the gate-source voltages of the first and second field effect transistors 30, 32 can be set without being limited by the operation voltage Vreg, thereby eliminating the restriction by the switching operation by the operation voltage Vreg and providing volume adjustment over a wide range.

2) Because of the construction to control the amplitude of the first input signal Vg1 or the gate voltage of the first field effect transistor 30 in response to the operation voltage Vreg so that the gate-source voltage Vgs of the first field effect transistor 30, which switches the operation voltage Vreg based on the pulse width modulation type input signal, remains substantially constant, it is possible to control the change of the ON resistance of the first field effect transistor 30, thereby advantageously reducing distortion factor of the audio output by suppressing distortion of the driving signal Sd which is obtained by switching the operation voltage Vreg regardless of the volume setting.

3) Because the amplitude of the driving signal Sd is varied by controlling the operation voltage Vreg by the operation voltage control means for volume adjustment, it is advantageous for suppressing noise components contained in the driving signal Sd as described hereunder.

FIG. 4 is a descriptive illustration to show noise spectrum and waveforms of the digital amplifier 100.

FIGS. 4 (A1) and (A2) are noise spectrum of the PCM type input signal Spcm in FIG. 1, (B1) and (B2) are noise spectrum of the input signal Spwm after PWM conversion in FIG. 1, (C1) and (C2) are waveforms of the driving signal Sd outputted from the output terminal 33, (D1) and (D2) are noise spectrum of the driving signal Sdout to be applied to the audio output means 200. (A1), (B1), (C1) and (D1) correspond to the conditions when the volume is set to a large value, while (A2), (B2), (C2) and (D2) correspond to the conditions when the volume is set to a second value which is smaller than the first value.

As shown in FIG. 4 (A1), the input signal Spcm contains both audio (solid line) and noise (dotted line). Although the noise level is less than the audio level, noise extends to a higher frequency bandwidth than the audio bandwidth.

As shown in FIG. 4 (B1), among the noise component in the input signal Spwm in which PWM conversion is carried out on the input signal Spcm, the portion overlapping with the audio bandwidth is shifted to a higher frequency bandwidth than the audio bandwidth. However, such sifted noise component is a cause of audio quality degradation in the audio output.

As shown in FIG. 4 (C1), since the volume is set to a relatively large first value, the driving signal Sd has a relatively large amplitude.

As shown in FIG. 4 (D1), the driving signal Sdout which passed through the low pass filter 34 and the coupling capacitor 36 contains the noise component which is similar to the case in FIG. 4 (B1).

Now, if the volume is set to the second value which is relatively lower than the first value, the changes as shown in FIGS. 4 (A2) through (D2) occur.

In other words, since no digital attenuator is used in this example of preferred embodiment of the present invention, there are no changes in the noise spectrum in the input signals Spcm and Spwm as shown in FIGS. 4 (A2) and (B2).

However, the amplitude in the driving signal Sd is reduced as shown in FIG. 4 (C2) and the audio level as well as the noise level in the driving signal Sdout decrease as shown in FIG. 4 (D2).

Accordingly, as the noise level is reduced in accordance with reduction of volume, it is advantageous in improving audio quality in a low volume setting.

On the contrary, a conventional digital amplifier which is constructed to input the input signal Spcm to a digital amplifier and performing a PWM conversion on its output has an inherent problem in that the amplitude of the PWM type driving signal remains unchanged and not decreasing the noise level contained in the driving signal even if the volume is set to a low value, thereby degrading audio quality in a low volume setting.

It is to be noted that the amplitude of the gate voltage Vg1 is controlled by the input signal control means in response to the change in the operation voltage Vreg so that the gate-source voltage Vgs1 of the first field effect transistor 30 remains substantially constant in this example of preferred embodiment of the present invention. However, the input signal control means may be eliminated if the change in the on resistance due to the change in the gate-source voltage Vgs1 is negligible.

Although N-channel type is used for the first and second field effect transistors 30, 32 in this example of preferred embodiment of the present invention, similar advantages can be achieved by using P-channel type for the first and second field effect transistors 30, 32. In case of using P-channel type first and second field effect transistors 30, 32, it is necessary to apply negative voltages as the gate voltages (Vg1, Vg2).

Also, it is to be noted that the low pass filter 34 should not be restricted to the particular construction as shown in this example of preferred embodiment of the present invention and various other known constructions may be used for the low pass filter.

The construction of the above mentioned PWM conversion means should not be restricted to the one comprising the over-sampling filter 20 and the ΔΣ modulation circuit 22.

In the digital amplifier 100 of this example of preferred embodiment of the present invention, it is arbitrary to add volume adjustment means comprising a digital attenuator and the like for performing volume adjustment by bit shifting the digital data of the PCM type input signal Spcm at the front stage of the pulse width modulation conversion means, for example, at the front stage of the over-sampling filter 20. In case of using the volume adjustment means together, it is advantageous for surely adjusting the amplitude of the driving signal Sd to zero or near zero by setting the digital data to zero or near zero.

[Embodiment 2]

Now, an embodiment 2 according to a preferred embodiment of the present invention will be described by reference to the drawings.

The embodiment 2 differs from the embodiment 1 in that a half bridge circuit including a pair of field effect transistors of identical polarity is used as the means for switching the operation voltage Vreg in the embodiment 1, while a full bridge circuit including 4 field effect transistors of identical polarity is used as the switching means for switching the operation voltage Vreg in the embodiment 2.

Figure 5:
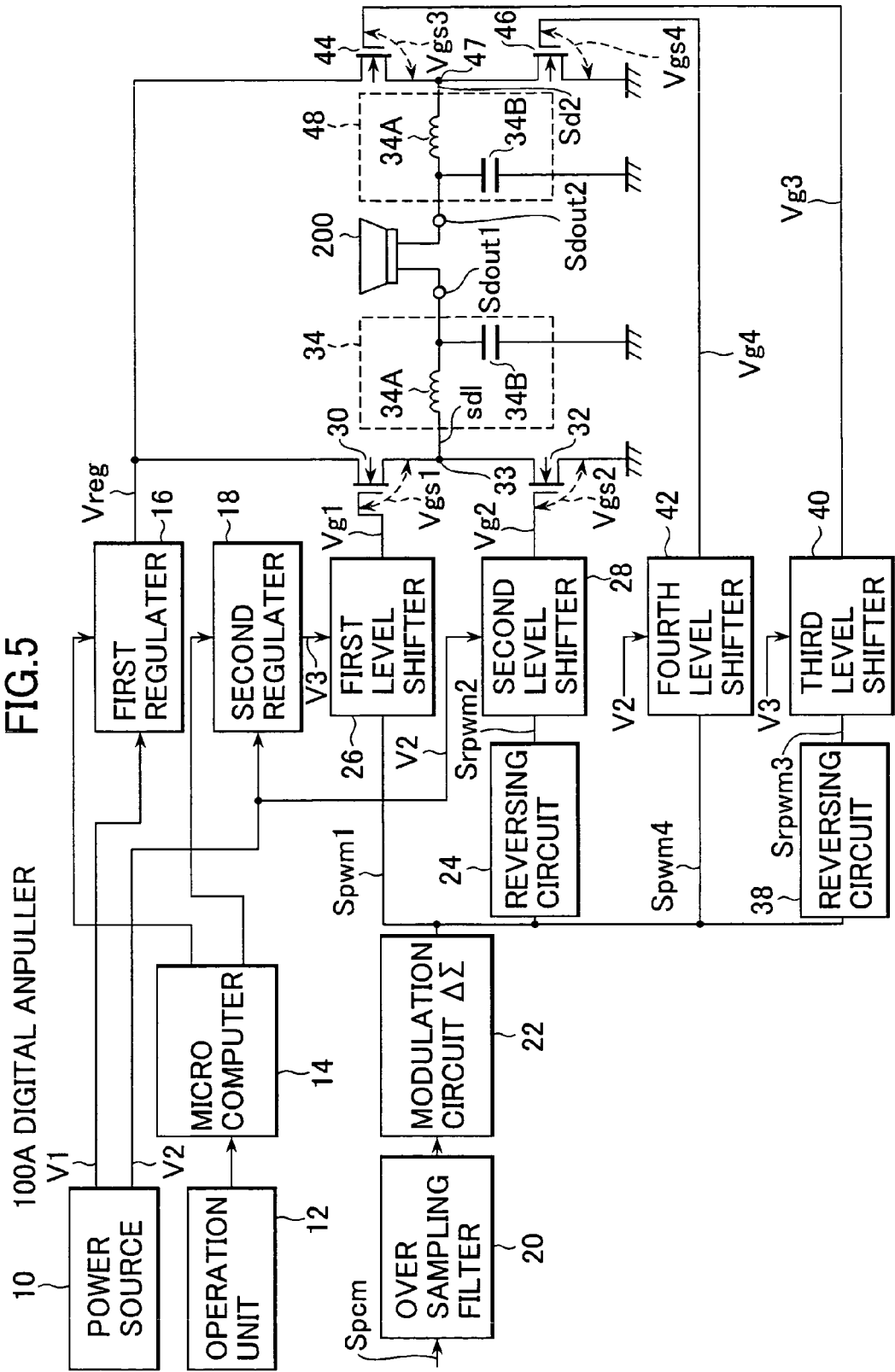
[FIG. 5]: is a block diagram to show a simplified construction of the digital amplifier 100A according to the embodiment 2.

FIG. 5 is a block diagram to show a simplified construction of the digital amplifier of the embodiment 2.

In the following descriptions, similar members and portions to those in the embodiment 1 as shown in FIG. 1 use the same reference numerals and duplicated description will be omitted, and portions which differ from the embodiment 1 will be described in detail.

The digital amplifier 100A includes an inverter circuit 38, third and fourth level shifters 40, 42, third and fourth field effect transistors 44, 46, a low pass filter 48 and the like in addition to the construction in the embodiment 1 but excludes the coupling capacitor 36 in the embodiment 1.

The first regulator generates the operation voltage Vreg, a positive DC voltage to be supplied to drains of the first and third field effect transistors 30, 44 based on the first voltage V1 which is supplied from the power supply unit 10 and is constructed so that the operation voltage Vreg is controlled by the micro computer 14.

The control of the operation voltage Vreg by the micro computer 14 is performed by the above mentioned volume setting data which is generated by the operation of the operation unit 12.

The second regulator 18 generates the third voltage V3, a DC voltage to be supplied to the first and third level shifters 26, 42 based on the second voltage V2 and the third voltage V3 is controlled by the micro computer 14.

The control of the third voltage V3 by the micro computer 14 will be described hereinafter.

The inverter circuit 38 is constructed, in a similar way to the inverter circuit 24, to generate the input signal Srpwm having the inverted phase with respect to input signal Spwm from the ΔΣ modulation circuit 22.

For convenience in the description hereunder, the input signal to be applied to the first level shifter 26 from the ΔΣ modulation circuit 22 is referred to as a first input signal Spwm1, the input signal to be applied to the second level shifter 28 from the inverter circuit 24 is second input signal Srpwm2, the input signal to be applied to the third level shifter 40 from the inverter circuit 38 is a third input signal Srpw3 and the input signal to be applied to the fourth level shifter 42 from the ΔΣ modulation circuit 22 is a fourth input signal Spwm4.

The third level shifter 40 and the fourth level shifter 42 perform respectively amplitude (crest value) conversion of the third and fourth input signals Srpwm3 and Spwm4 before being applied to the gates of the third and fourth field effect transistors 44 and 46 and such conversion is to secure the gate-source voltages Vgs which are required for driving the third and fourth field effect transistors 44 and 46, similar to the conversion by the first and second level shifters 26, 28.

Since the third level shifter 40 converts the amplitude of the third input signal Srpwm 3 based on the third voltage V3 which is supplied from the second regulator 18, the third voltage V3 increases or decreases under control of the micro computer 14, thereby increasing or decreasing the amplitude of the third input signal Srpwm3 which is outputted from the third level shifter 40.

Since the fourth level shifter 42 performs amplitude conversion of the fourth input signal Spwm4 based on the constant second voltage V2 which is supplied from the power supply unit 10, the fourth input signal Srpwm which is outputted from the fourth level shifter 28 remains constant.

The first and second field effect transistors 30, 32 and the third and fourth field effect transistors 44, 46 include all field effect transistors of identical polarity and are the first through fourth field effect transistors 30, 32, 44, 46 are N-channel field effect transistors in this example of preferred embodiment of the present invention.

The third field effect transistor 44 has the drain connected to the operation voltage Vreg, the source connected to the drain of the of the fourth field effect transistor 46 and the gate for receiving the third input signal Srpwm from the third level shifter 40 for on/off operation.

The fourth field effect transistor 46 has the source connected to the ground potential as the reference voltage and the gate for receiving the fourth input signal Spwm from the fourth level shifter 42 for on/off operation.

The junction point of the source of the third field effect transistor 44 and the drain of the fourth field effect transistor 46 constitutes the output terminal 47 from which the PWM type driving signal Sd2 is outputted.

For convenience of the following description, the output terminal 33 is referred to as a first output terminal 33, the output terminal 47 is referred to as a second output terminal 47, the driving signal outputted from the first output terminal 33 is referred to as a first driving signal Sd1 and the driving signal outputted from the second output terminal 47 is referred to as a second driving signal Sd2.

In a similar way to the first and second field effect transistors 30, 32, when either one of the third and fourth field effect transistors 44, 46 is on, the other is off, thereby alternately outputting the operation voltage Vreg or the ground potential on the second output terminal 47.

Accordingly, the first and second driving signals Sd1 and Sd2 are PWM type signals having the same amplitude (crest value) equal to the operation voltage Vreg and opposite in phase with each other.

The low pass filter 48 has the same construction as the low pass filter 34 and is constructed to convert the second driving signal Sd2 outputted from the second output terminal 47 into the audio signal in the audio bandwidth. Accordingly, the low pass filters 34, 48 are constructed to generate driving signals Sdout1 and Sdout2 which are audio signals having the opposite phases with each other.

In this example of preferred embodiment of the present invention, the driving signals Sdout1 and Sdout2 are inputted to both input terminals of the audio output means 200 for driving the same. In other words, the switching means includes a full bridge circuit including four field effect transistors 30, 32, 44, 46.

As a result, the coupling capacitor 36 in the embodiment 1 is not needed, thereby eliminating adverse effect by the impedance developed by the coupling capacitor 36, particularly impedance to the audio signal in a low frequency bandwidth and advantageously improving audio quality of the audio signal.

Again, in this example of preferred embodiment of the present invention, the micro computer 14 and the first regulator 16 constitute the operation voltage control means as recited in the claim.

The second regulator 18, the inverter circuit 24, the first level shifter 26 and the second level shifter 28 constitute the first input signal conversion means as recited in the claim.

The second regulator 18, the inverter circuit 38, the third level shifter 40 and the fourth level shifter 42 constitute the second input signal conversion means as recited in the claim.

The micro computer 14, the second regulator 18, the first level shifter 26 and the third level shifter 40 constitute the input signal control means as recited in the claim.

The first and second input signal conversion means and the first through fourth field effect transistors 30, 32, 44 and 44 constitute the switching means as recited in the claim.

It is to be noted that the operation voltage control means, the first and second input signal conversion means and the input signal control means should not be restricted to the constructions in this example of preferred embodiment of the present invention. Of course, they can be realized by using various known circuits.

It is also possible to construct the second input signal Srpw2 outputted from the inverter circuit 24 to be applied to the third level shifter 40 as the third input signal Srpw3. In this case, the inverter circuit 38 is no longer needed, thereby advantageously simplifying the circuit and reducing cost and power consumption.

Now, the operation of the digital amplifier 100A will be described. This example of preferred embodiment of the present invention is constructed to control the amplitude of the gate voltages (first and third input signals) Vg1 and Vg3 in response to the change in the operation voltage Vreg so that the gate-source voltages of the first field effect transistor 30 and third field effect transistor 44 remain substantially constant.

Since the amplitude control of the gate voltages Vg1 and Vg3 is substantially the same as the control operation of the gate voltage Vg1 as described in the embodiment 1, the detailed control operation is omitted and description will be made on signal waveforms on various parts when the gate voltages Vg1 and Vg2 are controlled and not controlled.

Figure 6:
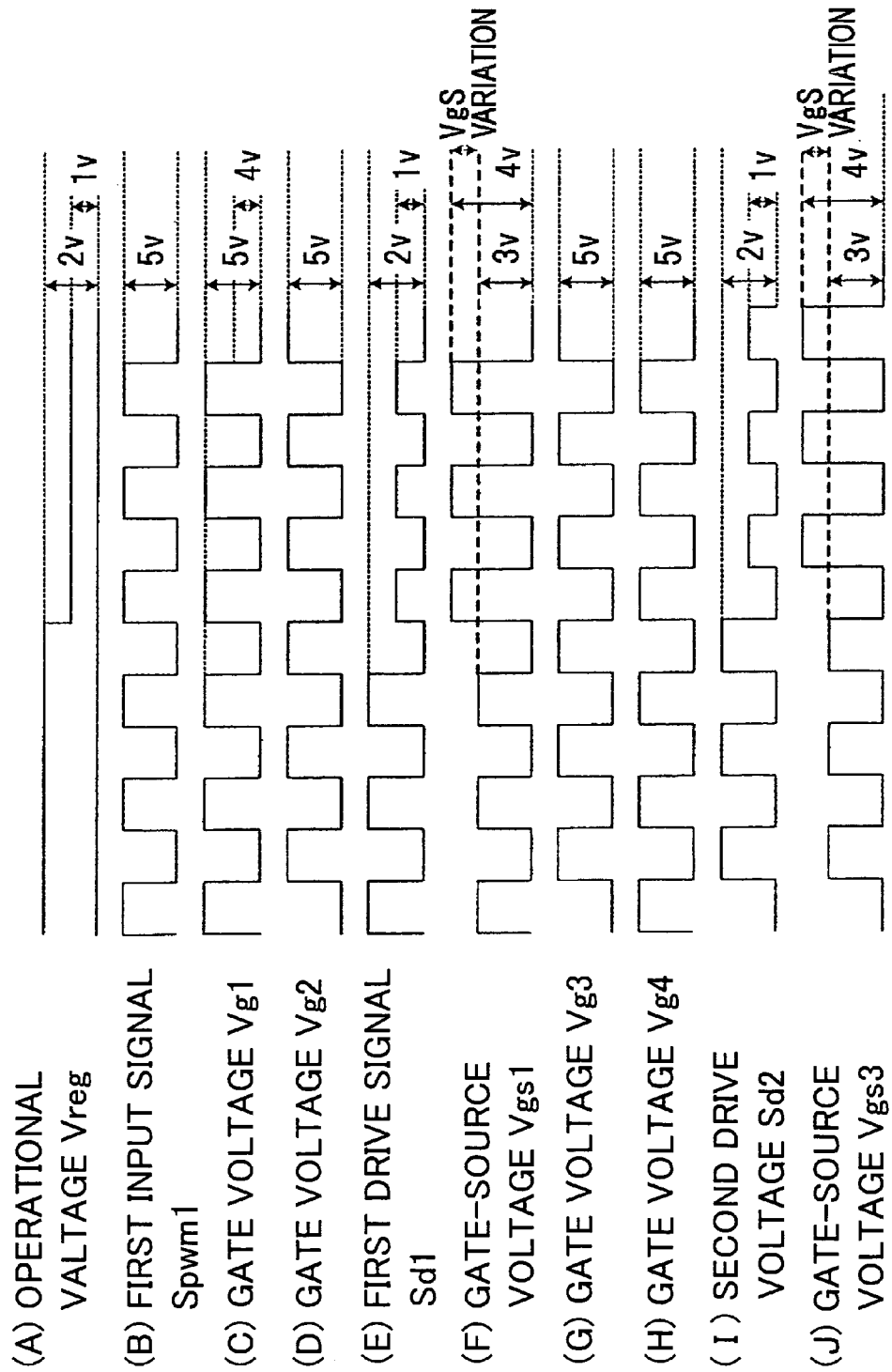
[FIGS. 6A to 6J]: are waveforms in case of not controlling the gate voltages Vg1 and Vg2 in the embodiment 2.
Figure 7:
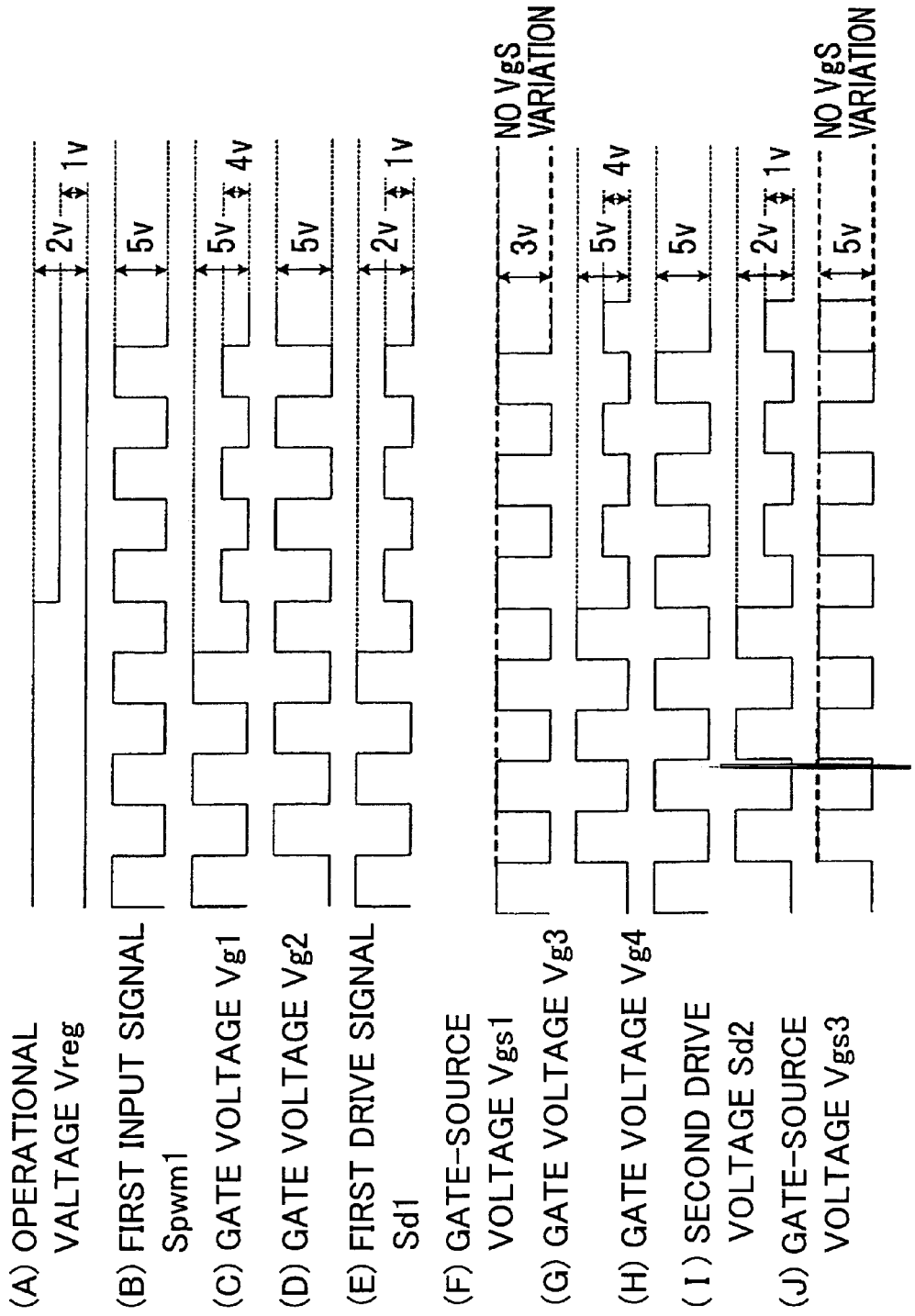
[FIGS. 7A to 7J]: are waveforms in case of controlling the gate voltages Vg1 and Vg2 in the embodiment 2.
Figure 8:
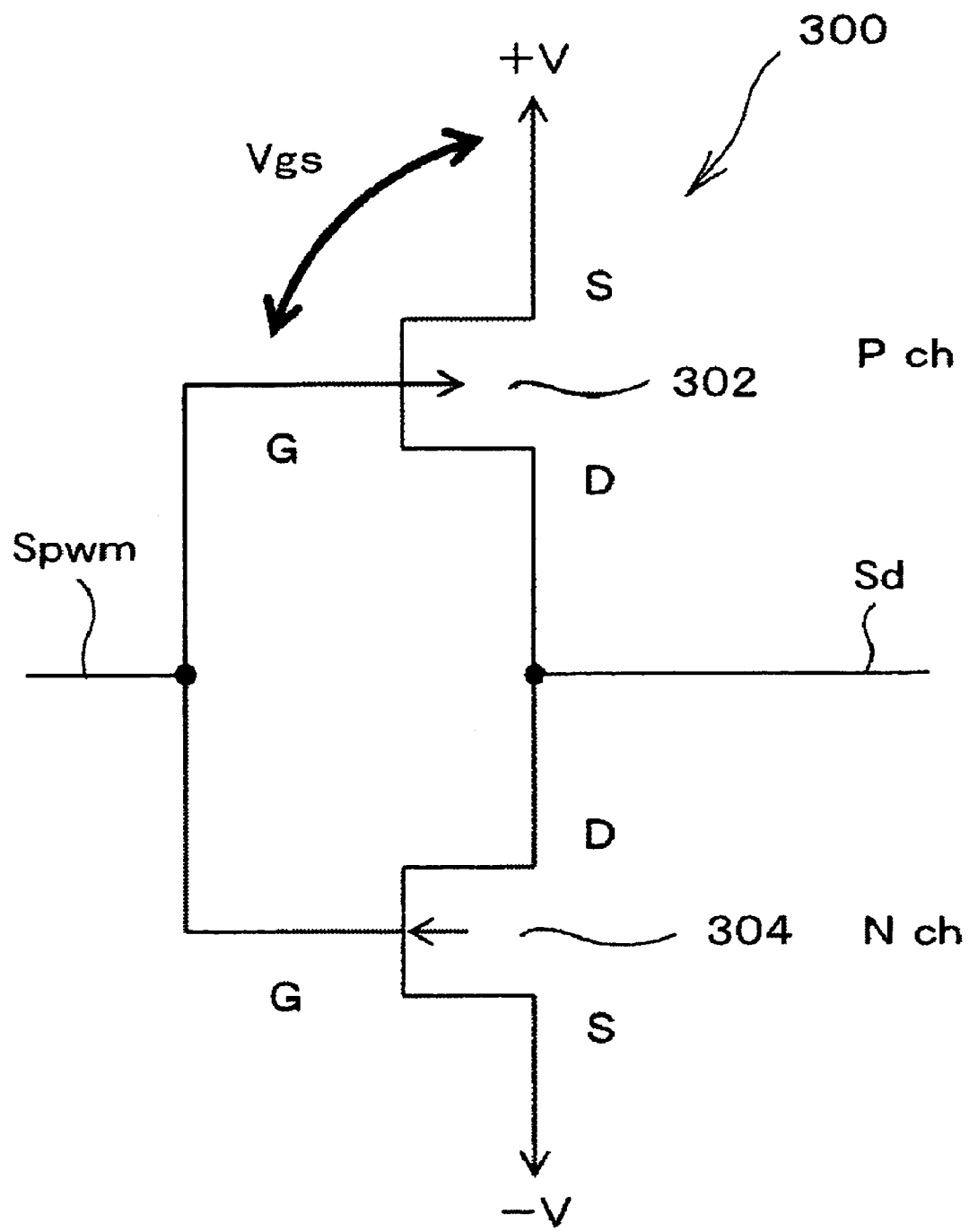
[FIG. 8]: is a schematic circuit to show the construction of a conventional digital amplifier.

FIG. 6 shows waveforms in the embodiment 2 when the gate voltages Vg1 and Vg3 are not controlled, while FIG. 7 shows waveforms in embodiment 1 when the gate voltages Vg1 and Vg3 are controlled.

In FIG. 6 and FIG. 7, (A) shows the operation voltage Vreg, (B) shows the first input signal Spwm1, (C) shows the gate voltage Vg1 of the first field effect transistor 30, (D) shows the gate voltage Vg2 of the second field effect transistor Vg2, (E) shows the first driving signal Sd1, (F) shows the gate-source voltage Vgs1 of the first field effect transistor 30, (G) shows the gate voltage Vg3 of the third field effect transistor 44, (H) shows the gate voltage Vg4 of the fourth field effect transistor 46, (I) shows the second driving signal Sd2 and (J) shows the gate-source voltage Vgs3 of the third field effect transistor 44.

First, a description will be made on the case in which the gate voltages Vg1 and Vg3 are not controlled.

As shown in FIG. 6(A), when the operation voltage Vreg is decreased, for example, from 2V to 1V by the operation of the volume adjustment, the amplitudes of the first and the second driving signals Sd1 and Sd2 also decrease from 2V to 1V.

At this time, as shown in FIGS. 6(C) and (G), since the gate voltages Vg1 and Vg3 remain unchanged from 5V, the first-source voltages Vgs1 and Vgs2 of the first and third field effect transistors 344 may change, for example, from 3V to 4V as shown in FIGS. 6(F) and (J). Therefore, the on resistances between the drain-source of the first and the third field effect transistors 30, 44 may fluctuate, thereby resulting in degrading the distortion factor of the audio which is outputted from the audio output means 200.

Now, a description will be made on the cases when the gate voltage Vg1 and Vg3 are controlled.

In a similar way to the above, as shown in FIG. 7, when the operation voltage Vreg is decreased, for example, from 2V to 1V by operating the volume adjustment, the amplitudes of the first and second driving signals Sd1, Sd2 also decrease from 2V to 1V.

In response to the change of the operation voltage Vreg from 2V to 1V, the micro computer 14 controls the first and third level shifters 26, 40 by way of the second regulator 18, thereby controlling the amplitudes of the gate voltages Vg1 and Vg2 from 5V to 4V as shown in FIGS. 7(C) and (G), thereby maintaining the amplitudes of the gate-source voltages Vg1 and Vg3 at 5V as shown in FIGS. 7(F) and (J).

As a result, fluctuation of the on resistances between the drain and source of the first and third field effect transistors 30, 44 is suppressed, thereby preventing degradation of distortion factor of the audio signal which is outputted from the audio output means 200.

As described hereinabove, in the digital amplifier 100A according to this example of preferred embodiment of the present invention, even if constructed in a full bridge by using four field effect transistors, the following advantages can be achieved in a similar way to the embodiment 1.

1) Since the gate-source voltages of the first through fourth field effect transistors 30, 32, 44 and 46 can be set without restriction by the operation voltage Vreg and the switching operation is not restricted by the operation voltage Vreg, volume adjustment can be made advantageously over a wide range.
2) Since variation of the on resistances of the first and the third field effect transistors 30, 44 can be suppressed, distortion in the driving signal which is derived by switching the operation voltage Vreg can be suppressed and thus advantageously reducing the distortion factor of the audio output.
3) Since the amplitudes of the first and second driving signals Sd1 and Sd2 are varied by controlling the operation voltage Vreg by the operation voltage control means for performing volume adjustment, it is advantageous to suppress noise components contained in the first and second driving signals Sd1 and Sd2.

It is to be noted in this example of preferred embodiment of the present invention that the first and second input signal control means can be eliminated if the change in the on resistances of the first and third field effect transistors 30, 44 is negligible.

Although N-channel type transistors are used as the first through fourth field effect transistors 30, 32, 44 and 46 in this example of preferred embodiment of the present invention, the same advantages can be achieved by using P-channel transistors. In case of using P-channel field effect transistors, the gate voltages (Vg1, Vg2, Vg3, Vg4) are need to be negative voltages.

Various known constructions may be used as the low pass filters 34, 48. And it is also possible in this example of preferred embodiment of the present invention to add volume adjustment means comprising a digital attenuator and the like at front stage of the pulse width modulation means.

It is therefore to be observed that the present invention is not limited to the above-mentioned examples of preferred embodiments, which are merely descriptions of the present invention in its preferred form under a certain degree of particularity. It should be understood that they are by no means to be construed so as to limiting the scope of the present invention. It is therefore to be understood to those of ordinary skill in the art that many other changes, variations, combinations, sub-combinations and the like are possible therein without departing from the scope and spirit of the present invention.

What is claimed is:

1. A digital amplifier comprising:
    a switching means for outputting a driving signal by switching an operation voltage constituted by a DC voltage based on a pulse width modulation input signal;
    an operation voltage control means for controlling the value of the operation voltage; wherein
    the switching means includes an input signal conversion means and a first and a second field effect transistors of mutually identical polarity;
    the drain of the first field effect transistor is connected to the operation voltage;
    the source of the first field effect transistor and the drain of the second field effect transistor are connected in common to an output terminal of the switching means;
    the source of the second field effect transistor is connected to a reference voltage;
    the input signal conversion means generates a first input signal in phase with the input signal and a second input signal of an inverted phase with respect to the input signal;
    the first input signal is supplied to the gate of the first field effect transistor while the second input signal is supplied to the gate of the second field effect transistor; and wherein
    the digital amplifier further comprises:
    a first input signal controlling means for controlling an amplitude of the first input signal according to a change in the operation voltage in order to make a gate-source voltage of the first field effect transistor approximately constant.

2. The digital amplifier according to claim 1, further comprising:
    a pulse width modulation conversion means for converting a pulse coded modulation input signal to a pulse width modulation input signal; wherein the pulse width modulation conversion means includes:
    an over sampling filter for inputting the pulse coded modulation input signal; and
    a $\Delta\Sigma$ modulation circuit for generating the pulse width modulation input signal by inputting an output signal of the over sampling filter.

3. The digital amplifier according to claim 1, further comprising a pulse width modulation conversion means for converting a pulse coded modulation input signal to a pulse width modulation input signal, wherein a front stage of the pulse width modulation conversion means has a volume adjustment means provided for performing volume adjustment by bit-shifting digital data constituting the pulse coded modulation input signal.

4. A digital amplifier comprising:
    a switching means for outputting a driving signal by switching an operation voltage constituted by a DC voltage based on a pulse width modulation input signal;
    an operation voltage control means for controlling the value of the operation voltage; wherein
    the switching means comprises a first and a second input signal conversion means and a first, a second, a third and a fourth field effect transistors of mutually identical polarity; the drains of the first and the third field effect transistors are connected to the operation voltage;

the source of the first field effect transistor and the drain of the second field effect transistor are connected in common to a first output terminal of the switching means for outputting the driving signal;

the sources of the second and the fourth field effect transistors are connected to a reference voltage;

the first input signal conversion means generates a first input signal in phase with the input signal and a second input signal of an inverted phase with respect to the input signal;

the first input signal is supplied to the gate of the first field effect transistor while the second input signal is supplied to the gate of the second field effect transistor;

the second input conversion means generates a third input signal of inverted phase with respect to the input signal and a fourth input signal in phase with the input signal;

the third input signal is supplied to the gate of the third field effect transistor while the fourth input signal is supplied to the gate of the fourth field effect transistor; and the digital amplifier further comprises:

an input signal controlling means for controlling an amplitude of the first input signal according to a change in the operation voltage in order to make the gate-source voltage of the first field effect transistor approximately constant, and for controlling an amplitude of the third input signal according to a change in the operation voltage in order to make the gate-source voltage of the third field effect transistor approximately constant.

5. A digital amplifier comprising:

a switching means for outputting a driving signal by switching an operation voltage constituted by a DC voltage based on a pulse width modulation input signal;

an operation voltage control means for controlling the value of the operation voltage;

a first input signal controlling means for controlling an amplitude of a first input signal according to a change in the operation voltage in order to make a gate-source voltage of a first field effect transistor approximately constant;

a second input signal controlling means for controlling an amplitude of a second input signal according to a constant voltage in order to make a gate-source voltage of a second field effect transistor approximately constant; wherein the switching means includes an input signal conversion means and the first and second field effect transistors, where the first and second field effect transistors are of mutually identical polarity;

the drain of the first field effect transistor is connected to the operation voltage;

the source of the first field effect transistor and the drain of the second field effect transistor are connected in common to an output terminal of the switching means;

the source of the second field effect transistor is connected to a reference voltage;

the input signal conversion means generates the first input signal in phase with the pulse width modulation input signal and the second input signal of an inverted phase with respect to the pulse width modulation input signal; and the first input signal is supplied to the gate of the first field effect transistor while the second input signal is supplied to the gate of the second field effect transistor.

* * * * *